(12) United States Patent
Bamnolker et al.

(10) Patent No.: US 9,595,470 B2
(45) Date of Patent: Mar. 14, 2017

(54) METHODS OF PREPARING TUNGSTEN AND TUNGSTEN NITRIDE THIN FILMS USING TUNGSTEN CHLORIDE PRECURSOR

(71) Applicant: Lam Research Corporation, Fremont, CA (US)

(72) Inventors: Hanna Bamnolker, Cupertino, CA (US); Raashina Humayun, Los Altos, CA (US); Juwen Gao, San Jose, CA (US); Michal Danek, Cupertino, CA (US); Joshua Collins, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/703,732

(22) Filed: May 4, 2015

(65) Prior Publication Data
US 2015/0325475 A1    Nov. 12, 2015

Related U.S. Application Data (60) Provisional application No. 61/991,356, filed on May 9, 2014, provisional application No. 62/075,092, filed on Nov. 4, 2014.

(51) Int. Cl.
*H01L 21/768* (2006.01)
*H01L 21/285* (2006.01)
(Continued)

(52) U.S. Cl.
CPC ...... *H01L 21/76877* (2013.01); *C23C 16/045* (2013.01); *C23C 16/14* (2013.01);
(Continued)

(58) Field of Classification Search
CPC ............ H01L 21/768; H01L 21/76877; H01L 21/76876
See application file for complete search history.

(56) References Cited

U.S. PATENT DOCUMENTS 7,211,144 B2 * 5/2007 Lu ........................... C23C 16/14
                                                    117/101
7,405,158 B2 * 7/2008 Lai ........................ C23C 16/0281
                                                    257/E21.17
(Continued)

OTHER PUBLICATIONS

U.S. Appl. No. 14/723,353, filed May 27, 2015, entitled "Methods of Filling High Aspect Ratio Features With Fluorine Free Tungsten."

(Continued)

*Primary Examiner* — Mamadou Diallo
(74) *Attorney, Agent, or Firm* — Weaver Austin Villeneuve & Sampson LLP (57) ABSTRACT

Methods for forming tungsten film using fluorine-free tungsten precursors such as tungsten chlorides are provided. Methods involve depositing a tungsten nucleation layer by exposing a substrate to a reducing agent such as diborane ($B_2H_6$) and exposing the substrate to a tungsten chloride, followed by depositing bulk tungsten by exposing the substrate to a tungsten chloride and a reducing agent. Methods also involve diluting the reducing agent and exposing the substrate to a fluorine-free precursor in pulses to deposit a tungsten nucleation layer. Deposited films exhibit good step coverage and plugfill.

14 Claims, 5 Drawing Sheets

(51) Int. Cl.
*C23C 16/52* (2006.01)
*C23C 16/04* (2006.01)
*C23C 16/14* (2006.01)
*C23C 16/455* (2006.01)

(52) U.S. Cl.
CPC ........ *C23C 16/45523* (2013.01); *C23C 16/52* (2013.01); *H01L 21/28556* (2013.01); *H01L 21/28562* (2013.01); *H01L 21/28568* (2013.01); *H01L 21/76876* (2013.01)

(56) References Cited

U.S. PATENT DOCUMENTS

| | | | |
|---|---|---|---|
| 8,696,921 | B2 | 4/2014 | Park et al. |
| 9,230,815 | B2 | 1/2016 | Fu et al. |
| 2003/0190424 | A1 | 10/2003 | Sneh |
| 2012/0009785 | A1* | 1/2012 | Chandrashekar ..... C23C 16/045 438/669 |
| 2013/0168864 | A1* | 7/2013 | Lee ................... C23C 16/0281 257/753 |
| 2014/0073135 | A1* | 3/2014 | Guan .................. C23C 16/14 438/680 |
| 2014/0120723 | A1 | 5/2014 | Fu et al. |
| 2015/0348840 | A1 | 12/2015 | Bamnolker et al. |

OTHER PUBLICATIONS

Ammerlaan et al.(1991) "Chemical vapour deposition of tungsten by $H_2$ reduction of $WCl_6$," *Applied Surface Science*, 53:24-29.

Ammerlaan et al. (Feb. 28, 1994) Thesis: "Kinetics and Characterization of Tungsten CVD Processes," *Delft University Press*, 180 pp.

Melliar-Smith et al. (Feb. 1974) "Chemically Vapor Deposited Tungsten for Semiconductor Metallizations," *J. Electrochem. Soc.* 121(2):298-303.

Pons et al. (2000) "Combined thermodynamic and mass transport modeling for material processing from the vapor phase," *Thin Solid Films*, 365:264-274.

Landingham et al. (Feb. 22, 1969) "Fine-Grain Tungsten by Chemical Vapor Deposition," *Journal of the Less-Common Metals, Elsevier Sequoia S.A.*, Lausanne—Printed in The Netherlands, 18:229-243.

Saeki et al. (1973) "Reaction process between tungsten hexachloride and hydrogen," *Journal of the Less-Common Metals, Elsevier Sequoia S.A.*, Lausanne—Printed in The Netherlands, 33:313-316.

U.S. Appl. No. 15/240,807, filed Aug. 18, 2016, entitled "Pulsing RF Power in Etch Process to Enhance Tungsten Gapfill Performance."

* cited by examiner

METHODS OF PREPARING TUNGSTEN AND TUNGSTEN NITRIDE THIN FILMS USING TUNGSTEN CHLORIDE PRECURSOR

CROSS-REFERENCE TO RELATED APPLICATIONS

This application claims benefit under 35 U.S.C. §119(e) of U.S. Provisional Patent Application No. 61/991,356, filed May 9, 2014, and titled "METHODS OF PREPARING TUNGSTEN AND TUNGSTEN NITRIDE THIN FILMS USING TUNGSTEN HEXACHLORIDE PRECURSOR," and also claims benefit under 35 U.S.C. §119(e) of U.S. Provisional Patent Application No. 62/075,092, filed Nov. 4, 2014, and titled "METHODS OF FILLING HIGH ASPECT RATIO FEATURES WITH FLUORINE FREE TUNGSTEN," both of which are herein incorporated by reference in their entireties and for all purposes.

BACKGROUND

Tungsten film deposition using chemical vapor deposition (CVD) techniques is an integral part of semiconductor fabrication processes. For example, tungsten films may be used as low resistivity electrical connections in the form of horizontal interconnects, vias between adjacent metal layers, and contacts between a first metal layer and the devices on a silicon substrate. In an example tungsten deposition process, a barrier layer is deposited on a dielectric substrate, followed by deposition of a thin nucleation layer of tungsten film. Thereafter, the remainder of the tungsten film is deposited on the nucleation layer as a bulk layer. Conventionally, the tungsten bulk layer is formed by the reduction of tungsten hexafluoride ($WF_6$) with hydrogen ($H_2$) in a chemical vapor deposition process.

SUMMARY

Provided herein are methods of depositing tungsten. One method involves exposing the substrate to a reducing agent and hydrogen, and exposing the substrate to a tungsten chloride to deposit the tungsten, whereby the ratio of hydrogen flow rate to reducing agent flow rate is between about 10:1 and about 100:1. The tungsten chloride may be selected from the group consisting of $WCl_2$, $WCl_4$, $WCl_5$, $WCl_6$, and mixtures thereof. In some embodiments, the tungsten is deposited at a temperature between about 450° C. and about 650° C.

The reducing agent may be selected from the group consisting of boranes, silanes, and germanes. In various embodiments, the flow rate of the reducing agent is between about 100 sccm and about 500 sccm. The substrate may be exposed to the reducing agent for a duration between about 0.25 and about 10 seconds.

Another aspect involves a method includes prior to depositing a bulk tungsten layer, forming a tungsten nucleation layer by exposing the feature to alternating pulses of a dilute reducing agent and tungsten pentachloride.

The amount of tungsten deposited per cycle of the alternating pulses may be at least about 100 Å. The reducing agent may be selected from the group consisting of boranes, silanes, and germanes. In some embodiments, the reducing agent is diluted by flowing hydrogen, and the ratio of hydrogen flow rate to reducing agent flow rate is between about 10:1 and about 100:1.

The method may also include depositing a bulk tungsten layer on the tungsten nucleation layer by chemical vapor deposition using a tungsten-containing precursor. The tungsten-containing precursor may be selected from the group consisting of $WF_6$, $WCl_2$, $WCl_4$, $WCl_5$, $WCl_6$, and mixtures thereof.

Another method includes: depositing a tungsten nucleation layer by pulsing tungsten pentachloride and a reducing agent and mitigating decomposition of the reducing agent, and depositing a tungsten bulk layer by chemical vapor deposition using tungsten pentachloride.

In various embodiments, the reducing agent is selected from the group consisting of silanes, boranes, and germanes. The reducing agent decomposition may be mitigated by diluting flow of the reducing agent.

In some embodiments, the reducing agent decomposition is mitigated by introducing hydrogen gas at a flow rate at least about 10 times greater than the flow rate of the reducing agent. In some embodiments, the reducing agent decomposition is mitigated by pulsing the reducing agent at a temperature less than the temperature when pulsing the tungsten pentachloride.

Another aspect involves a method including: (a) exposing the substrate to a reducing agent at a first temperature, and (b) exposing the substrate to a fluorine-free tungsten precursor at a second temperature, whereby the first temperature is less than the second temperature.

Another aspect involves an apparatus for processing substrates including (a) at least one process chamber including a pedestal configured to hold a substrate; (b) at least one outlet for coupling to a vacuum; (c) one or more process gas inlets coupled to one or more process gas sources; and (d) a controller for controlling operations in the apparatus, including machine-readable instructions for: (i) introducing a reducing agent and hydrogen to the process chamber; (ii) introducing a fluorine-free tungsten precursor to the process chamber; and iii) repeating (i)-(ii) in a first stage to deposit a tungsten nucleation layer, whereby the ratio of hydrogen flow rate to reducing agent flow rate is between about 10:1 and about 100:1 during (i). The fluorine-free tungsten precursor may be selected from the group consisting of $WCl_2$, $WCl_4$, $WCl_5$, $WCl_6$, and mixtures thereof.

These and other aspects are described further below with reference to the drawings.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor device fabrication often involves the deposition of tungsten films, particularly in trenches or vias to form interconnects. In a conventional methods of depositing tungsten films, a nucleation tungsten layer is first deposited into a via or contact. In general, a nucleation layer is a thin conformal layer that serves to facilitate the subsequent formation of a bulk material thereon. The tungsten nucleation layer may be deposited to conformally coat the sidewalls and bottom of the feature. Conforming to the underlying feature bottom and sidewalls can be critical to support high quality deposition. Nucleation layers are often deposited using atomic layer deposition (ALD) or pulsed nucleation layer (PNL) methods.

In a PNL technique, pulses of reactant are sequentially injected and purged from the reaction chamber, typically by a pulse of a purge gas between reactants. A first reactant can be adsorbed onto the substrate, available to react with the next reactant. The process is repeated in a cyclical fashion until the desired thickness is achieved. PNL is similar to ALD techniques. PNL is generally distinguished from ALD by its higher operating pressure range (greater than 1 Torr) and its higher growth rate per cycle (greater than 1 monolayer film growth per cycle). Chamber pressure during PNL deposition may range from about 1 Torr to about 400 Torr. In the context of the description provided herein, PNL broadly embodies any cyclical process of sequentially adding reactants for reaction on a semiconductor substrate. Thus, the concept embodies techniques conventionally referred to as ALD. In the context of the disclosed embodiments, CVD embodies processes in which reactants are together introduced to a reactor for a vapor-phase reaction. PNL and ALD processes are distinct from CVD processes and vice versa.

After the tungsten nucleation layer is deposited, bulk tungsten is typically deposited by a chemical vapor deposition (CVD) process by reducing tungsten hexafluoride ($WF_6$) using a reducing agent such as hydrogen ($H_2$).

Conventional deposition of tungsten has involved the use of the fluorine-containing precursor $WF_6$. However, the use of $WF_6$ results in some incorporation of fluorine into the deposited tungsten film. The presence of fluorine can cause electromigration and/or fluorine diffusion into adjacent components and damages contacts, thereby reducing the performance of the device. As devices shrink, features become smaller and the detrimental effects electromigration as well as ion diffusion become more prominent, thereby causing device failure. Tungsten films containing traces of fluorine can thereby pose integration and reliability issues, as well as device performance issues related to the underlying films or device structures, such as vias and gates.

Fluorine-free tungsten (FFW) precursors are useful to prevent such reliability and integration issues or device performance issues. Current FFW precursors include metal organic precursors, but undesirable traces of elements from the metal organic precursors may be incorporated in the tungsten film as well, such as carbon, hydrogen, nitrogen, and oxygen. Some metal organic fluorine-free precursors are also not easily implemented or integrated in tungsten deposition processes.

Provided herein are methods of depositing fluorine-free tungsten films using a tungsten chloride ($WCl_x$), such as tungsten pentachloride ($WCl_5$) or tungsten hexachloride ($WCl_6$), as a precursor. Examples herein refer to $WCl_5$ and $WCl_6$ but it is understood that other tungsten chlorides including $WCl_2$, $WCl_4$, and mixtures thereof may be used with disclosed embodiments. Deposition by $WCl_5$ and $WCl_6$ presents challenges that are not present with $WF_6$, due to the latter compound's greater reactivity and tungsten chloride's possible etching character. Evaporated $WCl_6$ has a high enough vapor pressure to enable carrying it into the tungsten deposition chamber. However, $WCl_6$ may be more likely to etch the substrate than $WCl_5$. While $WCl_5$ is less likely to etch the substrate, $WCl_5$ also has a higher vapor pressure than $WCl_6$. Although the lower vapor pressure is useful in depositing tungsten films having low resistivity, some deposition may have poor step coverage. Tungsten chlorides are less reactive, and as a result, deposition is performed at higher temperature than deposition using $WF_6$. However, some reducing agents used to reduce the tungsten chloride, such as during tungsten nucleation layer deposition, may decompose at higher temperatures. Disclosed embodiments mitigate decomposition of these reducing agents to deposit conformal, smooth, non-porous, films having low resistivity, good adhesion, and good step coverage and gap fill in small features. Some example methods involve alternating cycles of $B_2H_6$ and $WCl_5$ for as little as two cycles and depositing bulk tungsten by CVD using $WCl_5$. The level of chlorine incorporation into the tungsten film is also low and in some cases, no chlorine is incorporated into the tungsten film.

Figure 1:
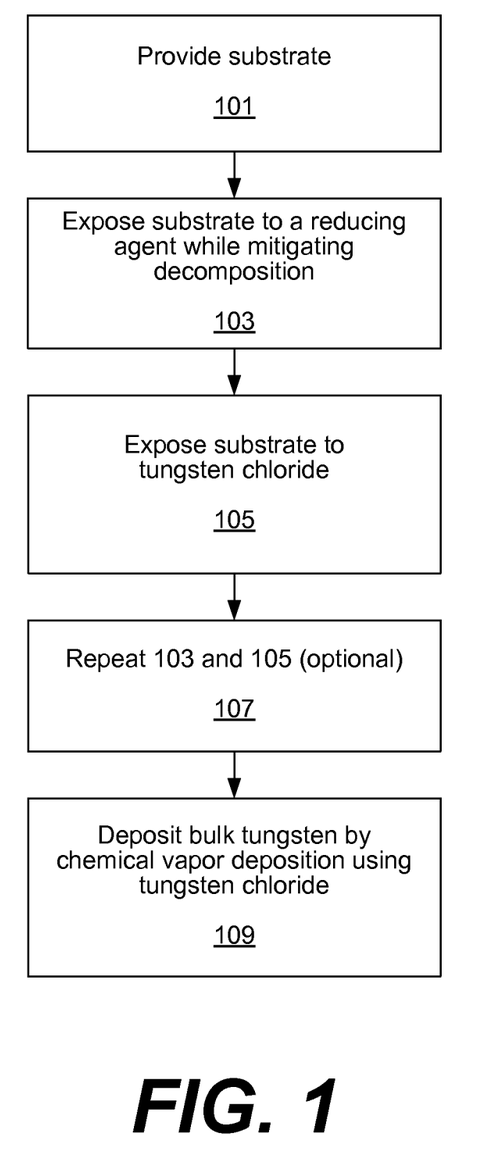
FIG. 1 is a process flow diagram for operations performed in accordance with disclosed embodiments.

FIG. 1 is a process flow diagram depicting operations performed in accordance with the described embodiments. The method described with respect to FIG. 1 may be performed at any chamber pressure. In some embodiments, the chamber pressure is between about 5 Torr and about 100 Torr, or about 40 Torr, though higher pressures (e.g., up to atmospheric pressure) may be used.

In operation 101, a substrate is provided. As an example, the substrate may be a substrate having one or more features to be filled with tungsten. According to various embodiments, the substrate feature has an aspect ratio of at least about 10:1, at least about 15:1, at least about 20:1, at least about 25:1, or at least about 30:1. Also according to various embodiments, the feature size is characterized by the feature opening size in addition to or instead of the aspect ratio. The opening may be from about 10 nm to about 100 nm, or about 10 nm to about 50 nm wide, or about 20 nm. For example, in certain embodiments, the methods may be advantageously used with features having narrow openings, regardless of the aspect ratio. In certain embodiments, the recessed feature is formed within a dielectric layer on a substrate, with the bottom of the feature providing contact to an underlying metal layer. Also in certain embodiments, the feature includes a liner/barrier layer on its sidewalls and/or bottom. Examples of liner layers include titanium/titanium nitride (Ti/TiN), TiN, and tungsten nitride (WN). In some embodiments, the substrate may include a deposited layer of TiN deposited using physical vapor deposition (PVD) or another suitable technique such that the thickness of the TiN film is between about 100 Å and about 300 Å. In some embodiments, the substrate may include a deposited layer of TiN deposited using ALD to a thickness of between about 30 Å and about 35 Å. In some embodiments, the TiN layer is deposited on a 2000 Å oxide layer on a bare silicon substrate. In addition to or instead of diffusion barrier layers, the feature may include layers such as an adhesion layer, a nucleation layer, a combination of thereof, or any other applicable material lining the sidewalls and bottom of the feature.

In operation 103, the substrate is exposed to a reducing agent while mitigating decomposition. This may be characterized as a reducing agent soak. In various embodiments, the reducing agent is diborane ($B_2H_6$). Other examples of reducing agents that may be used in operation 103 instead of $B_2H_6$ include other boranes, silanes such as silane ($SiH_4$) and germanes such as germane ($GeH_4$). For purposes of the description herein, $B_2H_6$ will be used as an example, but it should be appreciated that other reducing agents such as these may be used in accordance with the disclosed embodiments. It is noted that not soaking the substrate with the reducing agent prior to exposing the substrate to a tungsten chloride is highly undesirable and may lead to little or no tungsten deposition. In some embodiments, using a reducing agent other than hydrogen may better facilitate the growth of tungsten in subsequent operations. Without being bound by any particular theory, it is believed that the reducing agent soak in operation 103 helps facilitate uniform, non-porous tungsten growth at the desired temperature range in subsequent operations. As an example, a diborane soak used during tungsten nucleation using $WCl_5$ or $WCl_6$ may help facilitate tungsten deposition at temperatures less than about 500° C. while obtaining good step coverage. In some embodiments, the reducing gas exposure includes a carrier gas, such as nitrogen ($N_2$), argon (Ar), helium (He), hydrogen ($H_2$), or other inert gases. As an example, 35 sccm of a reducing agent may be flowed in 250 sccm of Ar.

The substrate is exposed to the reducing agent and decomposition of the reducing agent is mitigated during this operation by performing operation 103 at a low temperature such as between about 250° C. and about 450° or by diluting the reducing agent. Although operation 103 may be performed at a low temperature while operation 105 is performed at a higher temperature (e.g., between about 450° C. and about 650° C.) as described below, in some apparatuses or processes, adjusting the temperature between these two operations may not be feasible. For example, the temperature as described herein may be the pedestal temperature, which takes time to adjust to a new set temperature for methods performed in a single station or chamber tool. Some disclosed embodiments may also be performed in a multi-station tool but shifting between stations during tungsten nucleation layer deposition may reduce throughput.

As a result, decomposition may be mitigated by diluting the reducing agent while performing operation 103 at a high temperature such as greater than about 450° C. The reducing agent flow may be diluted in a number of ways, including reducing the flow rate of the reducing agent, reducing the duration of exposing the substrate to the reducing agent in operation 103, and introducing hydrogen at a high flow rate. In various embodiments, the flow rate of the reducing agent may be between about 100 sccm and about 500 sccm, for example about 300 sccm. In various embodiments, the exposure of the reducing agent may last less than about 15 seconds, for example, the exposure may last between about 0.25 seconds and about 10 seconds.

Hydrogen may also be flowed at a high flow rate. The ratio of the flow rate of hydrogen to reducing agent may be between about 5:1 and about 300:1, for example about 100:1. For example, at least about 100 times greater than the flow rate of the reducing agent. For example, if the reducing agent is flowed at a flow rate of about 300 sccm, then hydrogen may be co-flowed to the chamber at a flow rate of about 30 slm.

Without being bound by any particular theory, it is believed that during operation 103, in some embodiments, a thin layer of elemental boron, silicon, or germanium may be adsorbed onto the surface of the substrate by thermal decomposition of the reducing agent. For purposes of the following example, $B_2H_6$ will be used as an example, but it should be appreciated that other reducing agents such as these may be used in accordance with the disclosed embodiments. For example, the reaction for $B_2H_6$ decomposition may be:

$$B_2H_6(g) \rightarrow 2B(s) + 3H_2(g)$$

In this example, a high amount of hydrogen may be flowed with $B_2H_6$ to shift the reaction toward the left and thereby prevent $B_2H_6$ from decomposing to form elemental boron during this operation. For example, hydrogen may be flowed to a chamber housing the substrate at a flow rate greater than at least about 100 times the flow rate of $B_2H_6$ to mitigate decomposition of $B_2H_6$ to boron.

In operation 105 of FIG. 1, the substrate is exposed to a FFW precursor such as a tungsten chloride $WCl_x$, thereby depositing a tungsten nucleation layer. The tungsten chloride may be $WCl_2$, $WCl_4$, $WCl_5$, $WCl_6$, or combinations thereof. In some embodiments, operation 105 may be performed at a temperature between about 450° C. and about 650° C. In some embodiments, the temperature during operation 105 may be greater than the temperature during operation 103. Where the reducing agent is not diluted in operation 103, operation 103 may be performed at a lower temperature than operation 105 to reduce decomposition of the reducing agent. According to various embodiments, $H_2$ may or may not be flowed during operation 105. In some embodiments, the dose time of operation 105 may be greater than operation 103. For example, in some embodiments, the dose time may be about 2-5 times as long as the dose time in operation 103. In some embodiments, the dose time of operation 105 may be between about 1 second and about 20 seconds.

As noted above, in some embodiments, during operation 105, the substrate is exposed to a tungsten chloride and $H_2$ during operation 105. In some embodiments, an additional carrier gas is also flowed. Example carrier gases include nitrogen ($N_2$), argon (Ar), helium (He), or other inert gases.

In operation 107, operations 103 and 105 may be repeated for at least one additional cycle. A "cycle" may be defined as performing operation 103, followed by performing operation 105 in FIG. 1. In many embodiments, a total of two cycles may be performed to deposit the nucleation layer. Using the embodiments described herein, the growth rate of tungsten per cycle may be between about 1 Å and about 5 Å per cycle.

As described above, thermal decomposition of the reducing agent is mitigated or reduced in disclosed embodiments. In some embodiments, operations 103 and 105 are performed at different temperatures such that during the nucleation process, the first step of a cycle is performed at one temperature, and the second step of the cycle is performed at another temperature, which is greater than the first temperature. Performing operation 103 at a lower temperature reduces thermal decomposition of the reducing agent, while performing operation 105 at a higher temperature allows the FFW precursor to be sufficiently reactive to form the tungsten layer. That is, the first temperature as described above with respect to operation 103 may be lower than the second temperature as described with respect to operation 105. For example, operation 103 may be performed at a temperature of about 300° C. and operation 105 may be performed at a temperature of about 450° C. In some embodiments, performing cycles of operations 103 and 105, or performing a second cycle per operation 107, involves toggling the temperature in a single station for exposure to the reducing agent and FFW precursor. In some embodiments, performing cycles involves transferring the substrate from one station at a temperature suitable for exposure to the reducing agent to a second station at a temperature suitable for exposure to the FFW precursor.

In some embodiments, operations 103 and 105 are performed at the same temperature. For example, operations 103 and 105 may both be performed at about 450° C. In various embodiments, operations 103 and 105 are performed at the same temperature when hydrogen is flowed as a carrier gas during operation 103. In many embodiments, a thermal budget is observed such that the operations should be performed at a temperature as low as possible.

In some embodiments, operations 103 and 105 may be performed at the same temperature. In these embodiments, it may be advantageous to dilute the $B_2H_6$ with $H_2$ to prevent excess formation of the boron or boron-containing layer in operation 103.

In one example, a flow of $B_2H_6$ is introduced at a flow rate of about 35 sccm using argon as a carrier gas at a flow rate of about 250 sccm. Subsequent flow of $WCl_5$ or $WCl_6$ to deposit the nucleation layer by reacting $WCl_5$ or $WCl_6$ with $B_2H_6$ may include flowing $WCl_5$ or $WCl_6$ using a carrier gas such as argon flowing at about 50 sccm while flowing hydrogen at about 2000 sccm. The substrate's exposure to $B_2H_6$ followed by $WCl_5$ or $WCl_6$ may be performed for two cycles.

Without being bound by any particular theory, it is believed that during operation 103, in some embodiments, a thin layer of elemental boron may be adsorbed onto the surface of the substrate by thermal decomposition as described above. Subsequent introduction of $WCl_5$ or $WCl_6$ may then react with the boron present on the surface of the substrate to form tungsten. Without being bound by any particular theory, one possible mechanism for the deposition of tungsten using $WCl_5$ may be as follows:

$$3WCl_{5(g)} + 5B_{(s)} \rightarrow 3W_{(s)} + 5BCl_{3(g)}$$

Without being bound by any particular theory, one possible mechanism for the deposition of tungsten using $WCl_6$ may be as follows:

$$WCl_{6(g)} + 2B_{(s)} \rightarrow W_{(s)} + 2BCl_{3(g)}$$

It is observed that excess exposure time during operation 103 may lead to an excess layer of remaining elemental boron on the substrate even after subsequent exposure to $WCl_5$ or $WCl_6$. Conditions of operations 103 and 105 may be varied to achieve complete consumption of boron by $WCl_5$ or $WCl_6$. Due to the increased deposition rate of tungsten using the PNL technique of $B_2H_6$ and $WCl_5$ or $WCl_6$ as disclosed herein, as few as two nucleation cycles may be used to deposit a sufficient tungsten nucleation layer prior to depositing bulk tungsten by CVD.

Returning to FIG. 1, in operation 109, tungsten bulk fill is deposited using CVD by exposing the substrate to a FFW precursor and a reducing agent. Example substrate temperatures are as low as 450° C. and may be as high as 650° C. during the CVD reaction. In certain embodiments, the FFW precursor is a halogen-containing compound, such as $WCl_5$ or $WCl_6$. In certain embodiments, the reducing agent is hydrogen gas, though other reducing agents may be used, including silanes, boranes, and germanes. In some embodiments, CVD may be implemented in various stages, such as a low temperature stage and a high temperature stage. In certain embodiments, the CVD operation may take place in multiple stages, with multiple periods of continuous and simultaneous flow of reactants separated by periods of one or more reactant flows diverted.

An inert carrier gas may be used to deliver one or more of the reactant streams, which may or may not be pre-mixed. In various embodiments, the precursors are introduced using argon as a carrier gas. Other carrier gases may be used as appropriate. An inert gas such as argon or another gas such as nitrogen, or a combination thereof may be provided as the background gas simultaneously with the reducing gases or the $WCl_5$ or $WCl_6$ gases. In some embodiments, the background gas flow is continuous, i.e., it is not switched on and off throughout operations 103 through 109.

Unlike PNL or ALD processes, operation 109 may generally involve introducing the reactants continuously until the desired amount is deposited. In certain embodiments, the CVD operation may take place in multiple stages, with multiple periods of continuous and simultaneous flow of reactants separated by periods of one or more diverted reactant flows. Flows may also be pulsed for a pulse time between about 1 second and about 2 seconds. In some embodiments, the reactants are continuously flowed for a time between about 400 seconds and about 600 seconds. Example ranges of chamber pressure during CVD deposition may range from about 10 Torr to about 500 Torr, or about 40 Torr.

In certain embodiments, transitioning from operation 103 to operation 105 involves moving the substrate from one deposition station to another in a multi-station chamber. Still further, each of operation 103, operation 105, and operation 109 may be performed in a different station of the same multi-station chamber.

In alternative embodiments in which a single station is used to perform operations 103 and 105, transitioning from operation 103 to operation 105 may involve adjusting the flow of the reducing agent and hydrogen gas, or may involve shutting off a flow of the reducing agent (optionally allowing hydrogen or other carrier gas to run) while raising the substrate temperature. Once the substrate temperature is stabilized, the FFW precursor and other gases, if necessary, are flowed into the reaction chamber for the tungsten deposition.

In some embodiments, a barrier layer such as a tungsten nitride (WN) layer may be deposited on oxide surfaces using $WCl_5$ or $WCl_6$ as a precursor. For example, a tungsten nitride layer may be deposited by flowing ammonia ($NH_3$), followed by flowing $WCl_5$ or $WCl_6$, to thereby form a WN layer. In some embodiments, a layer of tungsten deposited by flowing $WCl_5$ or $WCl_6$ is exposed to ammonia ($NH_3$) to form a barrier layer of tungsten nitride (WN).

Apparatus

Any suitable chamber may be used to implement the disclosed embodiments. Example deposition apparatuses include various systems, e.g., ALTUS® and ALTUS® Max, available from Lam Research Corp., of Fremont, Calif., or any of a variety of other commercially available processing systems. The process can be performed on multiple deposition stations in parallel.

In some embodiments, the tungsten nucleation process is performed at a first station that is one of two, five, or even more deposition stations positioned within a single deposition chamber. In some embodiments, the two steps for the nucleation process are performed at two different stations of a deposition chamber. For example, the substrate may be exposed to diborane ($B_2H_6$) in a first station using an individual gas supply system that creates a localized atmosphere at the substrate surface, and then the substrate may be transferred to a second station to be exposed to a fluorine-free tungsten (FFW) precursor such as a tungsten chloride, e.g., tungsten pentachloride ($WCl_5$) or tungsten hexachloride ($WCl_6$), to deposit the nucleation layer. In some embodiments, the substrate may then be transferred back to the first station for a second exposure of a reducing agent. Then the substrate may be transferred to the second station for exposure to $WCl_5$ or $WCl_6$ to complete tungsten nucleation and proceed with bulk tungsten deposition in the same or different station. In some embodiments, the nucleation process is performed in a single station of a deposition chamber. For example, a reducing agent may be flowed with a high flow rate of hydrogen in a station, and a FFW precursor may be subsequently introduced to the same station to react with the reducing agent after an optional purge. One or more stations can then be used to perform chemical vapor deposition (CVD) as described. Two or more stations may be used to perform CVD in a parallel processing. Alternatively a wafer may be indexed to have the CVD operations performed over two or more stations sequentially.

Figure 2:
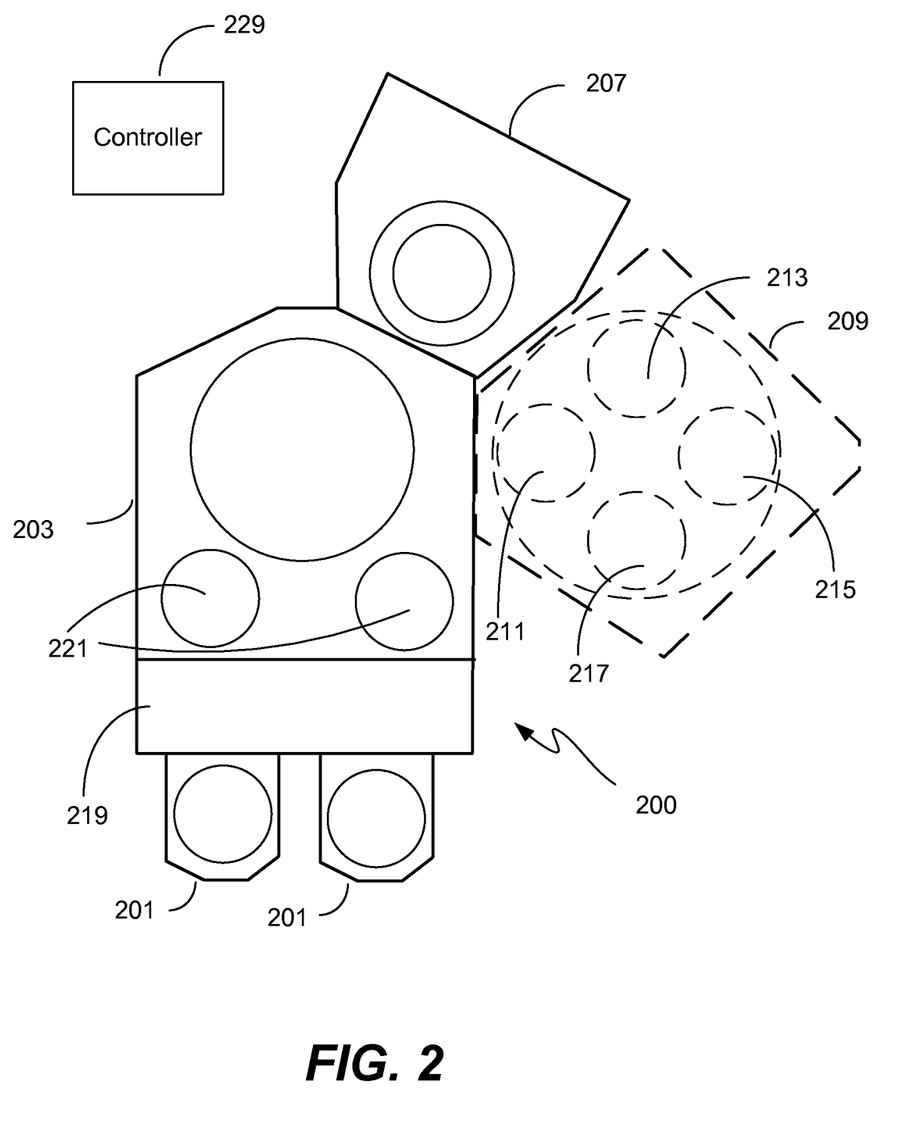
FIG. 2 is a schematic diagram of an apparatus or tool suitable for performing disclosed embodiments.
Figure 3:
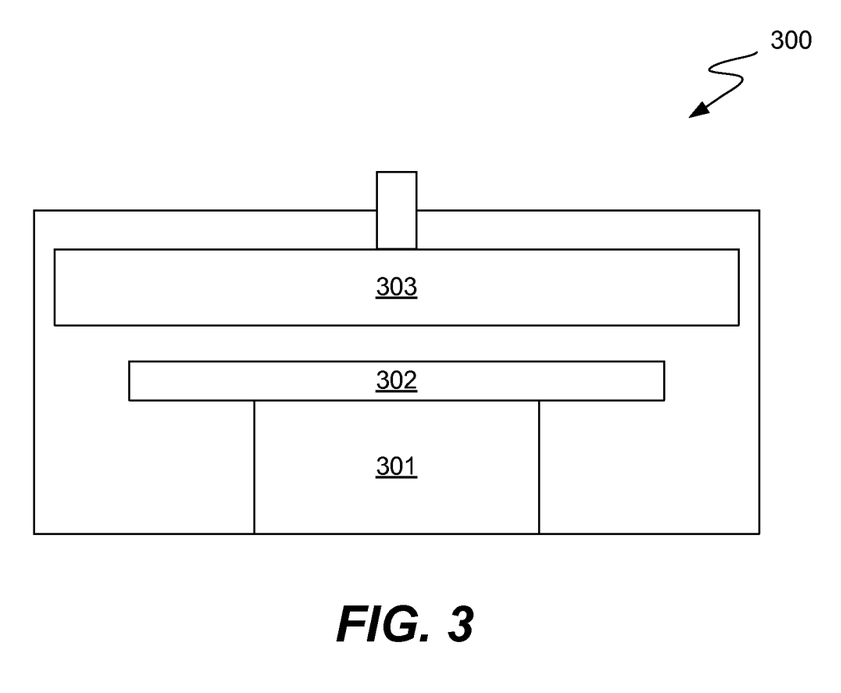
FIG. 3 is a schematic diagram of a process chamber for performing disclosed embodiments.

FIG. 2 is a block diagram of a processing system suitable for conducting tungsten thin film deposition processes in accordance with disclosed embodiments. The system 200 includes a transfer module 203. The transfer module 203 provides a clean, pressurized environment to minimize the risk of contamination of substrates being processed as they are moved between the various reactor modules. Mounted on the transfer module 203 is a multi-station chamber 209 capable of performing PNL deposition and CVD according to disclosed embodiments. Chamber 209 may include multiple stations 211, 213, 215, and 217 that may sequentially perform these operations. For example, chamber 209 could be configured such that stations 211 and 213 perform PNL deposition, and stations 215 and 217 perform CVD. Each deposition station includes a heated wafer pedestal and a showerhead, dispersion plate or other gas inlet. In some embodiments, station 211 may be used to deposit a tungsten nucleation layer using alternating pulses of a reducing agent and a FFW precursor, while flowing hydrogen during the reducing agent pulses at a high flow rate, while station 213 is used to perform CVD using hydrogen and a FFW precursor. An example of a deposition station 300 is depicted in FIG. 3, including wafer support 302 and showerhead 303. A heater may be provided in pedestal portion 301.

Also mounted on the transfer module 203 may be one or more single or multi-station modules 207 capable of performing plasma or chemical (non-plasma) pre-cleans. The module may also be used for various other treatments, e.g., reducing agent soaking. The system 200 also includes one or more (in this case two) wafer source modules 201 where wafers are stored before and after processing. An atmospheric robot (not shown) in the atmospheric transfer chamber 219 first removes wafers from the source modules 201 to loadlocks 221. A wafer transfer device (generally a robot arm unit) in the transfer module 203 moves the wafers from loadlocks 221 to and among the modules mounted on the transfer module 203.

In certain embodiments, a system controller 229 is employed to control process conditions during deposition. The controller 229 will typically include one or more memory devices and one or more processors. The processor may include a CPU or computer, analog and/or digital input/output connections, stepper motor controller boards, etc.

The controller 229 may control all of the activities of the deposition apparatus. The system controller 229 executes system control software including sets of instructions for controlling the timing, mixture of gases, flow rate of gases, chamber pressure, chamber temperature, wafer temperature, radio frequency (RF) power levels if used, wafer chuck or pedestal position, and other parameters of a particular process. Other computer programs stored on memory devices associated with the controller may be employed in some embodiments.

Typically there will be a user interface associated with the controller 229. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language. Alternatively, the control logic may be hard coded in the controller 229. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place.

The computer program code for controlling the deposition and other processes in a process sequence can be written in any conventional computer readable programming language: for example, assembly language, C, C++, Pascal, Fortran or others. Compiled object code or script is executed by the processor to perform the tasks identified in the program.

The controller parameters relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and may be entered utilizing the user interface.

Signals for monitoring the process may be provided by analog and/or digital input connections of the system controller 229. The signals for controlling the process are output on the analog and digital output connections of the deposition apparatus.

In some implementations, a controller 229 is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 229, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 229 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller 229 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 229, in some implementations, may be a part of or coupled to a computer that is integrated with, coupled to the system, otherwise networked to the system, or a combination thereof. For example, the controller 229 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 229 receives instructions in the form of data, which specify parameters for each of the processing steps to be performed during one or more operations. It should be understood that the parameters may be specific to the type of process to be performed and the type of tool that the controller 229 is configured to interface with or control. Thus as described above, the controller 229 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller 229 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in pedestal or chuck. Appropriately programmed feedback and control algorithms may be used with data from these sensors to maintain desired process conditions. The foregoing describes implementation of disclosed embodiments in a single or multi-chamber semiconductor processing tool.

The foregoing describes implementation of disclosed embodiments in a single or multi-chamber semiconductor processing tool. The apparatus and process described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically comprises some or all of the following steps, each step provided with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXPERIMENTAL

Experiment 1

An experiment was conducted that measured the deposition rate of tungsten films deposited in accordance with disclosed embodiments. A substrate including a nucleation layer 15-20 Å thick was exposed to $WCl_5$ and $H_2$ at 450° C. and 60 Torr to deposit tungsten by chemical vapor deposition (CVD). Another substrate including a nucleation layer 15-20 Å thick was exposed to $WCl_6$ and $B_2H_6$ at 450° C. and 60 Torr. The deposition rate was averaged and plotted in FIG. 4.

Figure 4:
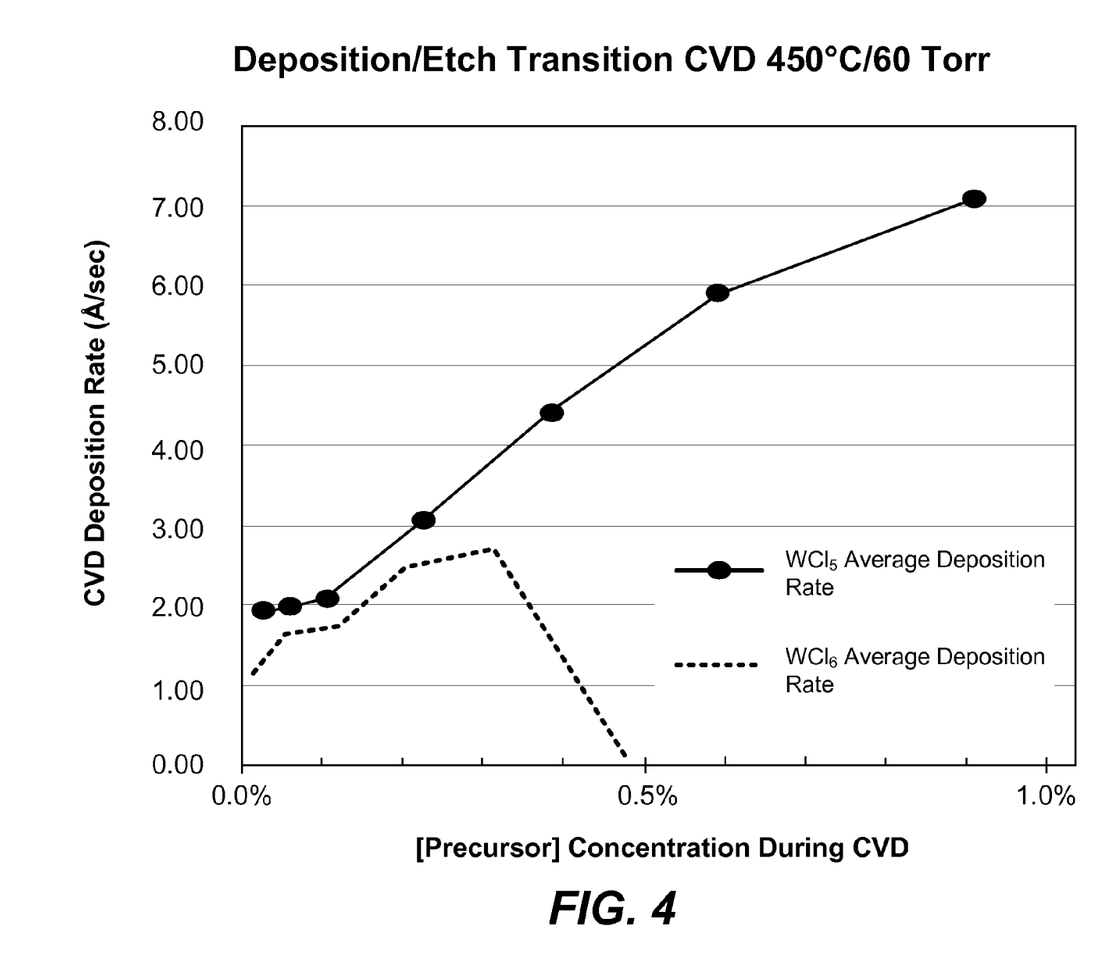
FIG. 4 is a plot of experimental data of deposition rates.

The solid lines in FIG. 4 represent the average deposition rate for $WCl_5$-deposited tungsten. The dotted line in FIG. 4 represents the average deposition rate for $WCl_6$-deposited tungsten. The deposition rate was plotted against precursor concentration. Note that as concentration of the precursor increased for $WCl_6$, CVD deposition rate eventually decreased at around 0.3-0.4% concentration, suggesting that at these concentrations, $WCl_6$ was etching more than depositing film on the substrate. This threshold characteristic of $WCl_6$ may limit its application to depositing tungsten at a high deposition rate. In contrast, $WCl_5$ is shown as consistently increasing in precursor concentration with higher deposition rates as high as 7.00 Å/second at about 0.8% concentration. Although $WCl_5$ deposition rate is expected to reach a maximum threshold whereby $WCl_5$ begins to etch the substrate rather than deposit film, these results suggest that $WCl_5$ may be a more viable option for depositing tungsten films than $WCl_6$.

Experiment 2

A process was conducted to evaluate the step coverage of tungsten feature fills deposited using tungsten hexachloride ($WCl_6$) as a precursor. A substrate with a feature having a 25 nm critical dimension was provided. Tungsten was deposited using tungsten nucleation and chemical vapor deposition (CVD) in accordance with the disclosed embodiments. The following process conditions were used:

| $B_2H_6$ Soak | | | | | |
|---|---|---|---|---|---|
| Cycle | Temp (° C.) | $B_2H_6$ Flow (sccm) | Dose time (s) | Pressure (Torr) | Ar flow (sccm) |
| $1^{st}$ | 300 | 35 | 15 | 40 | 250 |
| $2^{nd}$ | 300 | 35 | 15 | 40 | 250 |

| $WCl_6/H_2$ | | | | | |
|---|---|---|---|---|---|
| Cycle | Temp (° C.) | Ar Flow (sccm) | Dose time (s) | Pressure (Torr) | $H_2$ flow (sccm) |
| $1^{st}$ | 450 | 50 | 60 | 40 | 2000 |
| $2^{nd}$ | 450 | 50 | 600 | 40 | 2000 |

Figure 5:
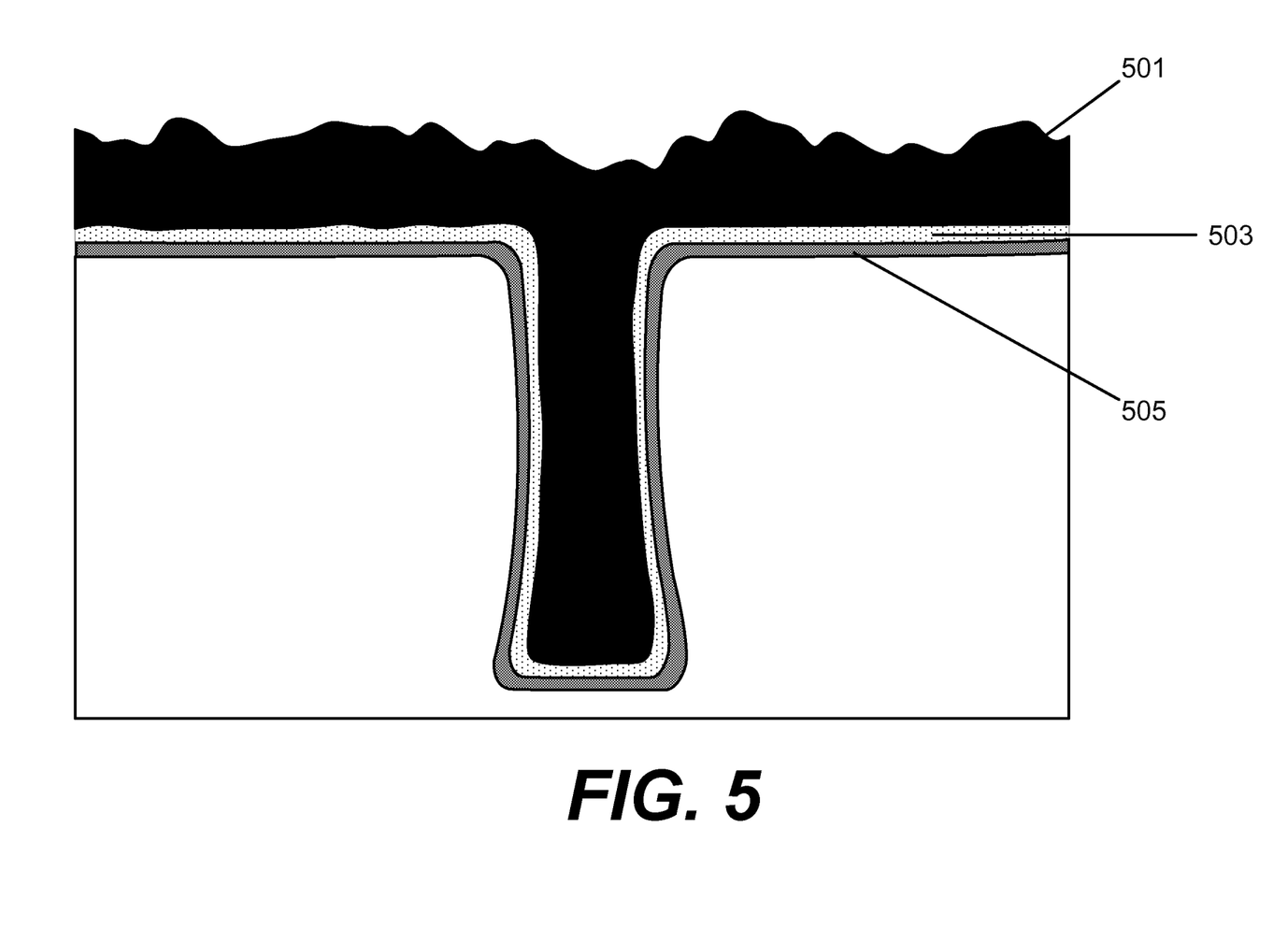
FIG. 5 is a schematic diagram of a via filled with tungsten in accordance with an experiment conducted by performing disclosed embodiments.

Each nucleation cycle included a diborane ($B_2H_6$) exposure, followed by a $WCl_6$ exposure at a temperature different from the temperature of the $B_2H_6$ exposure. The tungsten nucleation process was performed using two cycles ($B_2H_6/WCl_6/B_2H_6/WCl_6$). Subsequently, tungsten bulk fill was deposited by CVD using $WCl_6$ as a precursor. It is believed that in the above example, the $WCl_6/H_2$ portion of the second cycle includes both nucleation by a surface based reaction of $WCl_6$ with an adsorbed boron or boron-containing compound, followed by CVD reduction of $WCl_6$ by $H_2$ to form the bulk layer. The resulting deposited tungsten showed excellent step coverage and complete plug fill, as shown in the schematic depiction of a via in FIG. 5. As shown, FIG. 5 shows the tungsten bulk layer 501 on top of a tungsten nucleation or possibly tungsten boride layer (not shown). Under the tungsten is a thin 30 Å layer 503 of elemental boron, potentially from the initial exposure to diborane. Under the boron layer is a 25 Å TiN barrier layer 505. Note that in some conditions, a boron layer may not be formed. Although there is a thin layer of boron present, the results show the effective use of $WCl_6$ as a precursor for tungsten deposition using a $B_2H_6$ soak.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of depositing tungsten on a substrate, the method comprising:
   exposing the substrate to a reducing agent and hydrogen,
   exposing the substrate to a tungsten chloride to deposit the tungsten, and
   repeating the exposing the substrate to the reducing agent and the hydrogen and the exposing the substrate to the tungsten chloride in cycles to deposit the tungsten,
   wherein the ratio of hydrogen flow rate to reducing agent flow rate during the exposing the substrate to the reducing agent and the hydrogen is between about 10:1 and about 100:1.

2. The method of claim 1, wherein the tungsten chloride is selected from the group consisting of $WCl_2$, $WCl_4$, $WCl_5$, $WCl_6$, and mixtures thereof.

3. The method of claim 1, wherein the reducing agent is selected from the group consisting of boranes, silanes, and germanes.

4. The method of claim 1, wherein the tungsten is deposited at a temperature between about 450° C. and about 650° C.

5. The method of claim 1, wherein the flow rate of the reducing agent is between about 100 sccm and about 500 sccm.

6. The method of claim 1, wherein the substrate is exposed to the reducing agent for a duration between about 0.25 and about 10 seconds.

7. A method of depositing tungsten in a feature on a substrate, the method comprising:
   prior to depositing a bulk tungsten layer, forming a tungsten nucleation layer by exposing the feature to alternating pulses of a dilute reducing agent and tungsten pentachloride.

8. The method of claim 7, wherein the amount of tungsten deposited per cycle of the alternating pulses is at least about 100 Å.

9. The method of claim 7, wherein the reducing agent is selected from the group consisting of boranes, silanes, and germanes.

10. The method of claim 7, wherein the reducing agent is diluted by flowing hydrogen, and the ratio of hydrogen flow rate to reducing agent flow rate is between about 10:1 and about 100:1.

11. The method of claim 7, further comprising depositing a bulk tungsten layer on the tungsten nucleation layer by chemical vapor deposition using a tungsten-containing precursor.

12. The method of claim 11, wherein the tungsten-containing precursor is selected from the group consisting of $WF_6$, $WCl_2$, $WCl_4$, $WCl_5$, $WCl_6$, and mixtures thereof.

13. An apparatus for processing substrates, the apparatus comprising:
- (a) at least one process chamber comprising a pedestal configured to hold a substrate;
- (b) at least one outlet for coupling to a vacuum;
- (c) one or more process gas inlets coupled to one or more process gas sources; and
- (d) a controller for controlling operations in the apparatus, comprising machine-readable instructions for:
  - (i) introducing a reducing agent and hydrogen to the process chamber;
  - (ii) introducing a fluorine-free tungsten precursor to the process chamber; and
  - (iii) repeating (i)-(ii) in a first stage to deposit a tungsten nucleation layer,
- wherein the ratio of hydrogen flow rate to reducing agent flow rate is between about 10:1 and about 100:1 during (i).

14. The apparatus of claim 13, wherein the fluorine-free tungsten precursor is selected from the group consisting of $WCl_2$, $WCl_4$, $WCl_5$, $WCl_6$, and mixtures thereof.

* * * * *